United States Patent [19]
Armington et al.

[11] Patent Number: 5,680,698
[45] Date of Patent: Oct. 28, 1997

[54] METHOD FOR PRECISE ALIGNMENT AND PLACEMENT OF OPTOELECTRIC COMPONENTS

[75] Inventors: Richard Scott Armington, Mercer; Leroy Dorrell L'Esperance, Camden, both of N.J.

[73] Assignee: Lucent Technologies Inc., Murray Hill, N.J.

[21] Appl. No.: 590,236

[22] Filed: Jan. 23, 1996

Related U.S. Application Data

[62] Division of Ser. No. 350,766, Dec. 7, 1994, Pat. No. 5,590,456.
[51] Int. Cl.[6] .................................................. H05K 3/30
[52] U.S. Cl. ........................ 29/833; 29/834; 29/840; 29/DIG. 22; 219/121.65; 228/105
[58] Field of Search .......................... 29/720, 721, 740, 29/833, 834, 840, DIG. 22; 219/121.63–121.65; 228/105, 180.1, 180.21, 180.22

[56] References Cited

U.S. PATENT DOCUMENTS

| | | | |
|---|---|---|---|
| 4,793,707 | 12/1988 | Hata et al. | 29/721 X |
| 4,899,921 | 2/1990 | Bendat et al. | 228/180.22 X |
| 4,951,383 | 8/1990 | Amao et al. | 29/721 |
| 4,979,290 | 12/1990 | Chiba | 29/833 X |
| 5,018,936 | 5/1991 | Izumi et al. | 219/121.65 X |
| 5,152,055 | 10/1992 | L'Esperance et al. | 29/721 X |
| 5,212,880 | 5/1993 | Nishiguchi et al. | 29/833 X |
| 5,249,349 | 10/1993 | Kuinose et al. | 29/740 X |
| 5,311,304 | 5/1994 | Monno | 29/833 X |
| 5,372,294 | 12/1994 | Gore et al. | 228/105 |

FOREIGN PATENT DOCUMENTS

| 4123500 | 4/1992 | Japan | 29/721 |
|---|---|---|---|
| 6232597 | 8/1994 | Japan | 29/721 |

Primary Examiner—Peter Vo

[57] ABSTRACT

A method for superimposing an image of an optoelectric component on a substrate with the use of a single camera. Specifically, the camera looks through a transparent alignment tool that is holding the component, to the substrate below it, thus allowing both the component and the substrate to be seen together by the camera. The alignment tool and substrate are adjusted to precisely align the two and then are brought together while being seen by the camera. On laser chips, the chip is energized while on the glass alignment tool to produce a laser spot that is superimposed on the visible light image via a series of lenses and mirrors.

8 Claims, 3 Drawing Sheets

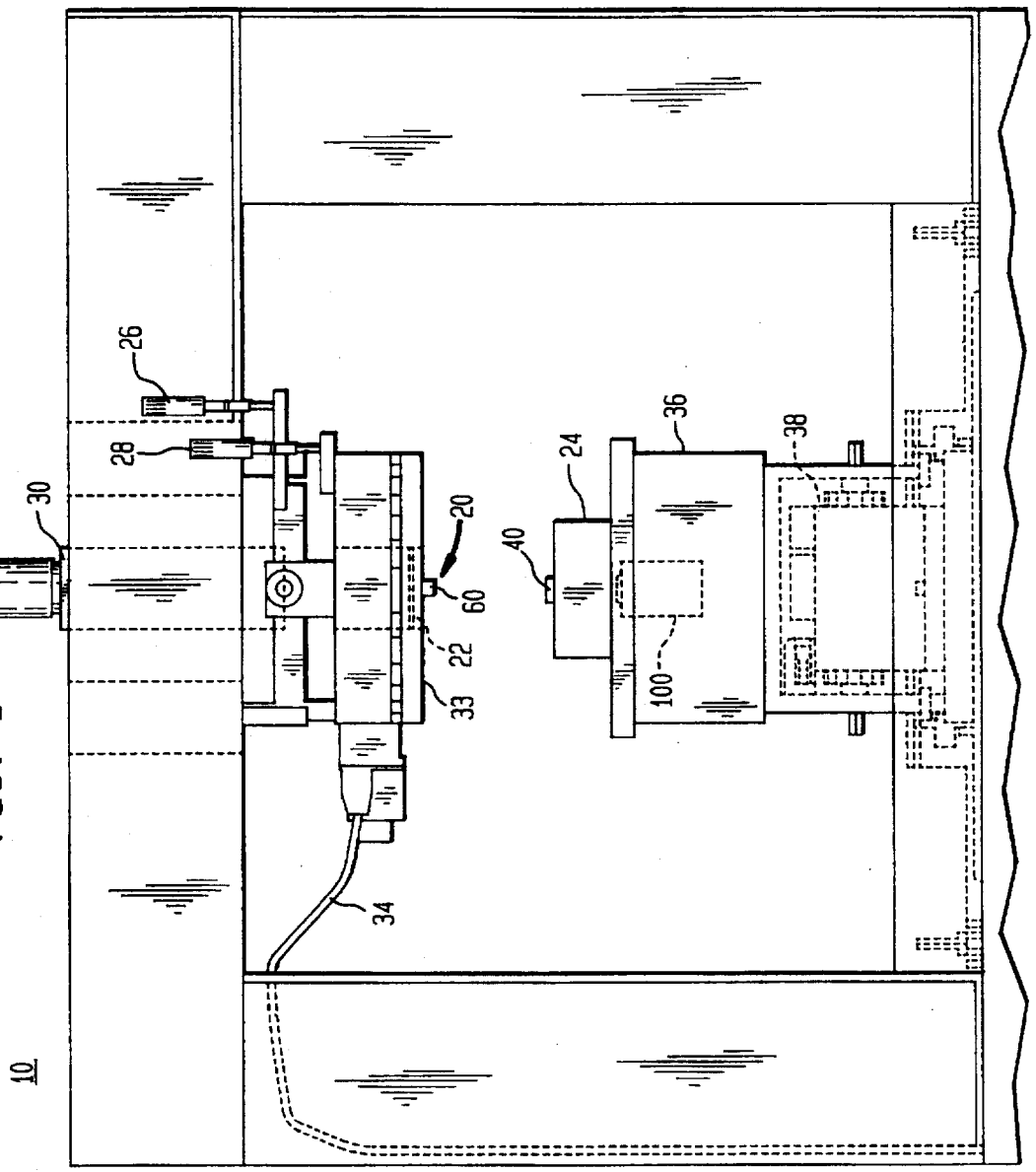

METHOD FOR PRECISE ALIGNMENT AND PLACEMENT OF OPTOELECTRIC COMPONENTS

This is a divisional of application Ser. No. 08/350,766 filed Dec. 7, 1994, now U.S. Pat. No. 5590456.

BACKGROUND OF THE INVENTION

1. Field of the Invention

This invention relates generally to optical and electronic bonding equipment and more particularly to bonding equipment for precisely aligning and placing optoelectric components on substrates.

2. Description of the Related Art

Precise alignment of surfaces in the placement of optoelectric components on substrates has received much attention. This is particularly true in VLSI circuit elements where the patterning of the circuit is microscopic or nearly microscopic. Many small components are typically bonded to these circuits. The problem with placing these small components with high precision, i.e. within microns, is accurately locating and correlating the component and placement position. Also, the component must be moved to the exact placement position without error.

The prior art has done this by moving the component over an uplooking visible light camera and the substrate under a downlooking visible light camera. A series of pictures are taken and the two images correlated. Corrections are made by the mechanical system to place the component over the substrate and the two are brought together. The difficulty in this prior art is that after the component and substrate are located by the cameras and vision system, they must be moved horizontally and vertically which introduces errors into the system. The greater the distance the component and substrate have to move, the greater is the alignment error that results from the smallest imprecision in the mechanical system's machined parts.

Another method employed is to position the component over the substrate and place a thin optical probe between them as in U.S. Pat. No. 4,899,921 to Bendat et al. The mechanical system will maintain alignment of the component and substrate for as long as the probe fits between. At some point the probe must be removed and the component and substrate moved together. It is at this point alignment errors are introduced.

SUMMARY OF THE INVENTION

In accordance with the principles of the invention, a transparent tool holding the component is provided. This allows a single, downwardly looking camera to view both the component and the substrate at the same time without having to move either the component or the substrate. Preferably, the transparent tool is formed of glass. More specifically, the component is held in place by a vacuum drawn on a capillary tube positioned between two glass optical flats. The component is held in contact with the lower flat that incorporates the outlet for the capillary tube. Since the entire structure is glass, the camera can look down directly on the component and also the substrate. Alignment and placement are simplified as the two images of the component and the substrate are superimposed during the placement process. Calibration of the system is also simplified as there is no longer a need to calibrate images from two different cameras. The apparatus is controlled to bring the surfaces of the component and the substrate into desired alignment by rotating the component and moving the bonding platform in orthogonal x, y and z directions.

This structure is particularly useful in the accurate placement of semiconductor laser chips on a substrate. In this configuration, the laser chip is energized and the lasing gap is located with respect to a feature on the chip using a vision system. Usually the chip is energized by contacting electrodes on its top and bottom. A metallization is placed on the transparent tool surface to contact the upper surface laser electrode and another contacting electrode is placed on the bottom. As an alternative, the tool may be metallized with Indium Tin Oxide (ITO), which is transparent and electrically conductive, or a material with similar properties, to function as one probe to energize the laser. Using the transparent tool allows the surface of the laser chip to be visible for alignment purposes.

The laser is energized via the ITO portion exciting the laser to emit light from the laser gap. Using a set of mirrors and beam splitter, the infrared optical path used to view the light from the lasing gap is folded into the same optic used to view the surface of the components allowing measurement offset for alignment correction. The folded light emitted from the single optic is then split back into two optical paths, one infrared and the other visible light. Two cameras, one for visible light and one for infrared light, are used simultaneously. This eliminates the need for placing the laser chip in front of an infrared camera located away from the bonding site to ascertain the position prior to alignment.

As simplification, illuminating the laser chip with infrared and near infrared light, rather than in the visible spectrum, would allow the infrared camera to capture both images, thus eliminate the need for two cameras.

As an alternative embodiment, a separate apparatus is used to correlate the lasing gap on the laser chip with an existing feature on the chip. The visible light image used in locating and correlating the feature on the separate apparatus is acquired using the visible light camera described above. The orientation and position of the lasing gap is now known with respect to the substrate and the laser can now be placed with high precision without actually firing the laser at the bonding station. Additionally, if the tool is metallized with ITO, or similar material, as previously described, it could function as one probe to energize the laser. The chip laser would then be positioned in front of the infrared camera and placed in contact with a second probe by the positioning system, and energized. This provides the added advantage of not needing to re-acquire the visible light image by the visible light camera, and thus, eliminating the visible light camera on the separate locating and correlating apparatus. This, in turn, simplifies any system calibration between the two pieces of apparatus.

BRIEF DESCRIPTION OF THE DRAWINGS

Preferred embodiments of the apparatus and method are described in detail hereinbelow with reference to the drawings wherein:

FIG. 1 is a plane view of the alignment and placement apparatus configured in accordance with a preferred embodiment of the present invention;

DETAILED DESCRIPTION OF THE PREFERRED EMBODIMENTS

Figure 1A:
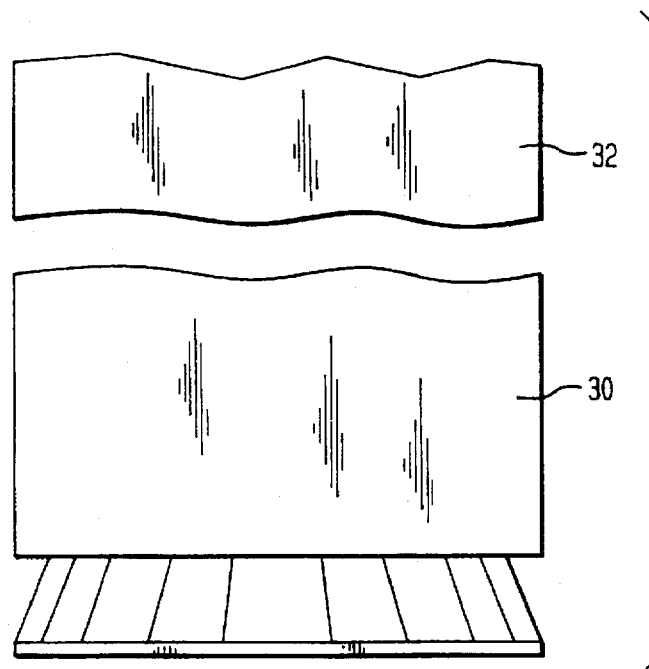
FIG. 1A is an expanded view of the downward looking video imaging camera.
Figure 1B:
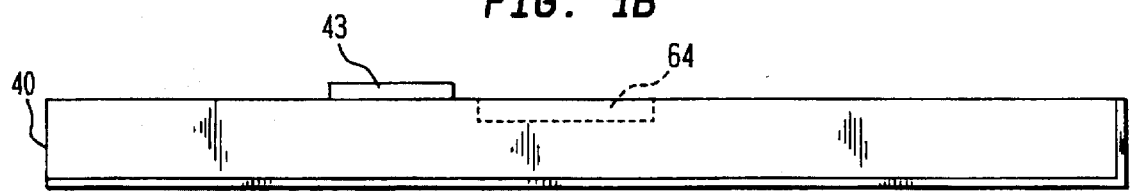
FIG. 1B is an expanded view of a substrate in which elements are place.

FIG. 1 illustrates, in a simplified manner, a preferred alignment and placement apparatus shown generally at 10. A component 60, e.g. a silicon or laser chip, is temporarily secured to the alignment tool 20 by drawing a vacuum between two flat plates 22 via hose 34. The alignment tool 20 is of a transparent glass having a very low coefficient of expansion, such as Zerodur™. A video imaging camera 32 (FIG. 1A) looks down through a series of optics 30 and through the transparent alignment tool 20, to the chip 60. The depth of field of optics 30 encompasses both the chip 60 and the substrate 40 into the video image. With the chip 60 now superimposed on the substrate 40, the alignment tool 20 is adjusted using adjustment micrometers 26 and 28 to correct the pitch and roll angles while yaw adjustment is performed by rotary stage 33.

The substrate 40 (FIG. 1B) is securely positioned on the bonding platform 24. The bonding platform 24 is sitting on a series of translational stages that move horizontally (x and y) and vertically (z). This translation and elevation is accomplished through a set of precision gears, air bearings and linear motors shown collectively at 38. The chip 60 is aligned to the substrate 40 by adjusting the translational table 36 and rotary stage 33 in the x and y direction while being viewed through the superimposed video image in the camera 32. The chip 60 and substrate 40 can be moved within microns of each other before final alignment. Once the chip 60 is properly aligned and planar with the substrate 40 whose plane is normal to the vertical travel, the bonding platform 24 is raised until the chip 60 and substrate 40 meet and are bonded in any of the conventional bonding methods, e.g., heat, hot gases, pressure or ultrasonic vibrations.

Figure 2:
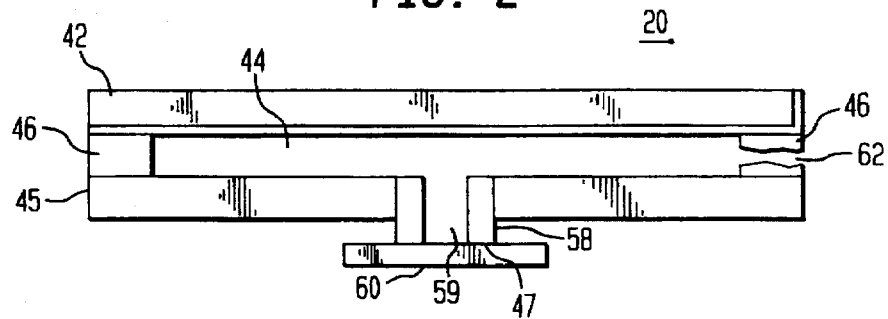
FIG. 2 is an expanded plane view of the alignment tool for use in the alignment and placement of energizable elements on a substrate.

The alignment tool 20 of the present invention, as depicted in FIG. 2, shows in detail the holding means of the chip 60. The alignment tool 20 is comprised of two parallel transparent glass plates 42 and 45, separated by an airtight spacer 46. A hole 59 is drilled vertically down through the lower glass plate 45 and fitted with a short length of capillary tube 58 so that the tube's lower surface 47 will hold the chip 60. The hole 59 in the tube 58 is small enough so that the chip 60 covers the entire hole 59. Drawing a vacuum in the space 44 between the upper glass plate 42 and lower glass plate 45 via hole 62 in spacer 46 effectively presses the chip 60 against the end of the capillary tube 47, where it remains while alignment is performed. When alignment is complete, the chip 60 and substrate 40 are brought together and the chip 60 is bonded on the bond pad 64. The vacuum is then relieved. Video camera 32, using optic 30, will look down through the transparent alignment tool 20 and capture an image combining views of the chip 60 and substrate 40 with bond pad 64. To further aid in aligning the chip 60 with the bond pad 64, fiducials may be placed on the chip 60 and the substrate 40 to facilitate placement. Alternatively, other features of the chip 60 may be used. The edges are normally not used as they are very sensitive to lighting changes and are prone to chipping.

Figure 3:
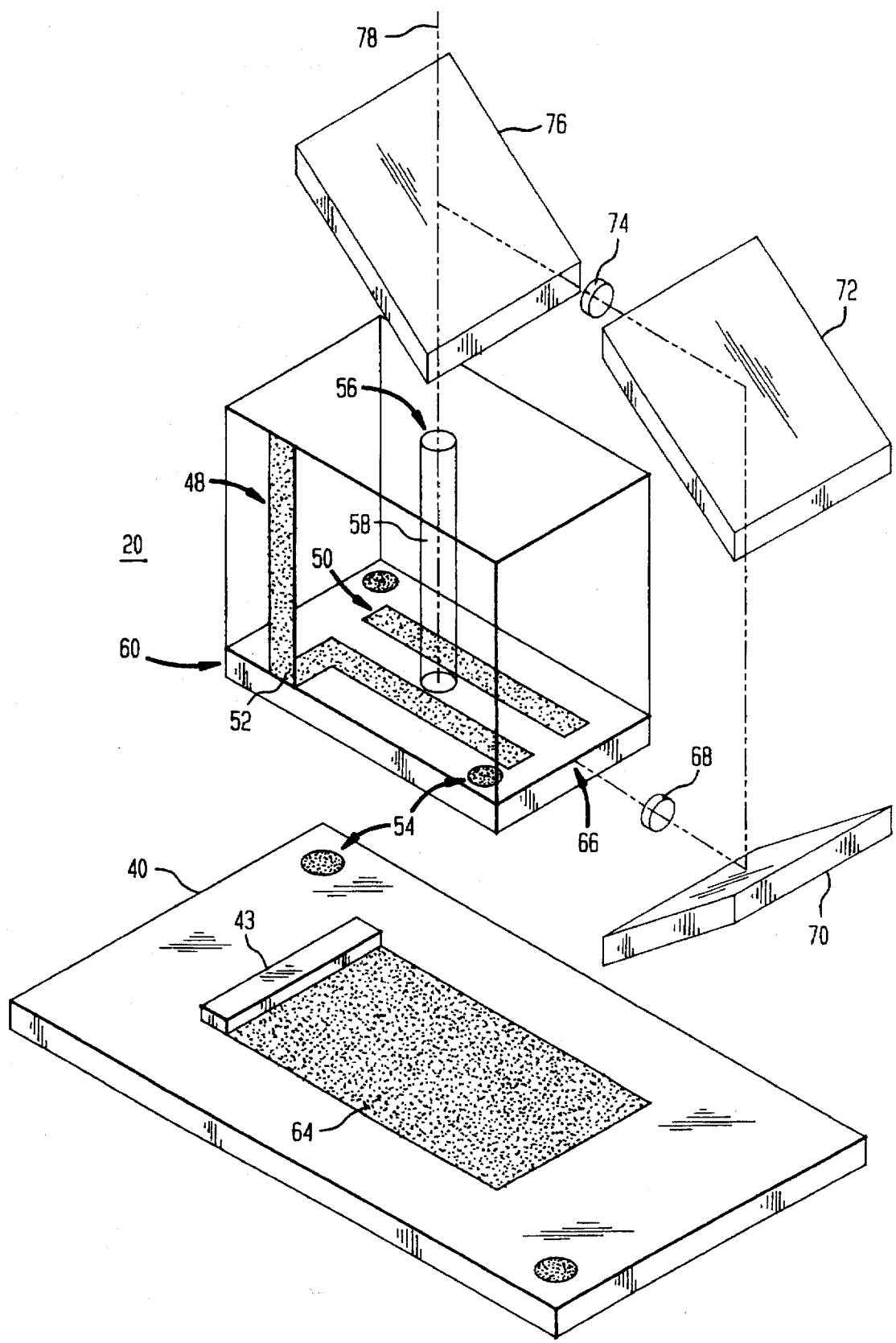
FIG. 3 is a perspective view of the alignment tool holding a laser chip using mirror imaging to align to the substrate.

As an addition to this embodiment, if chip 60 is a semiconductor laser chip, as shown in FIG. 3, and must be aligned to another optical component, such as an optical fiber or ball lens, with very high precision, the capillary tube's lower surface 47, which holds the laser chip 60, is metallized with ITO or some other suitable substance, so that it may be used as one contact to energize the laser chip 60. The energized laser chip 60 emits light from its lasing gap 66 forming a laser spot on a facet 67 of the laser chip 60. The laser spot 66, with respect to the other optical component, is used as a further means to align the laser chip 60 to the substrate 40. Once the laser chip 60 has made contact with the metallization at 52, by drawing the vacuum, it is then positioned in contact with a probe (not shown) as the second electrical contact to energize the laser chip 60. The laser spot 66 is then referenced to a feature such as the fiducials 54 on the top of the laser chip. 60. The information regarding the position of the laser spot 66 is then correlated to the image of the substrate 40 and the component 43, and the laser chip 60 is aligned at the proper location for bonding.

As a further embodiment to the basic preferred embodiment, FIG. 3 shows a perspective view of the alignment tool 20 holding a laser chip 60 using mirror imaging to align to the bond pad 64 on the substrate 40. The glass alignment tool 20 is metallized 48 to provide a circuit to energize the laser chip 60 while being held by vacuum through the capillary tube 58 to the alignment tool 20. It should be noted that these metallizations may be of any suitable material, including ITO and that the metallization location is dependent on the position of the connecting wire bond pads 50 on the laser chip 60. The circuit is completed at the electrical contacts 52 with the wire bond pads 50 on the laser chip 60. The energized laser chip 60 produces a laser spot 66. This spot 66 is collimated by a first lens 68, deflected ninety degrees by a first mirror 70, deflected a further ninety degrees by a second mirror 72, refocused by a second lens 74 and then directed upwards by a beam splitting lens 76. This final image of the spot 66 is superimposed on the visible light image 56 of the top of the laser chip 60 which propagates through the alignment tool 20. Visible light camera 32 is replaced with an infrared camera and laser chip 60 is illuminated with an infrared source for viewing its top. The combined image 78 is now captured and analyzed. Alignment adjustments are made to the laser chip 60 and substrate 40 before the substrate 40 is raised to the laser chip 60 and bonded. Position correction information is determined from the single combined image 56 of the laser spot 66 and the bond pad 64. The fiducials 54 are used as a secondary means of alignment with the laser spot 66. Due to the refractive index of the tool material being greater than air, some calibration is required due to the apparent and actual images of the top of the laser chip 60 being offset.

Although the subject invention has been described with respect to preferred embodiments, it will be readily apparent to those having ordinary skill in the art to which it appertains that changes and modifications may be made thereto without departing from the spirit or scope of the subject invention as defined by the appended claims.

What is claimed is:

1. A method for aligning and placing a component on a substrate wherein said component is capable of emitting light when energized, comprising the steps of:

holding said component to a tool means including a substantially light transmissive portion and at least one electrical conductor;

contacting said component to said at least one electrical conductor and electrically energizing said component to emit a beam of light;

viewing an image of the beam of light emitted by said component relative to an image of said substrate;

superimposing said image of the beam of light emitted by said component on the image of said substrate through said light transmissive portion, thereby obtaining positional information regarding said component relative to said substrate;

aligning said component to said substrate using said positional information; and bonding said component on said substrate.

2. The method of claim 1 wherein said component comprises a laser chip.

3. The method of claim 1 wherein the tool means electrical conductor is a transparent material.

4. The method of claim 3 wherein the transparent electrical conductor is indium tin oxide.

5. The method of claim 1 including the step of passing the beam of light emitted by the component through a beam splitter.

6. The method of claim 1 wherein at least one fiducial is included on at least one of said component and said substrate, and wherein said viewing step includes viewing an image of the beam of light emitted by the component relative to an image of said fiducial.

7. The method of claim 1 further including the step of illuminating the component with an infrared light to provide an infrared image of the component.

8. The method of claim 7 wherein the infrared image of the component is combined with a visible light image of the component.

* * * * *